219-121 SR
MTR09 XR 3,242,014
[redacted]

1

March 22, 1966 TAKESHI TAKAGI ETAL 3,242,014

METHOD OF PRODUCING SEMICONDUCTOR DEVICES

Filed Sept. 24, 1963

3,242,014
Patented Mar. 22, 1966

3,242,014

METHOD OF PRODUCING SEMICONDUCTOR DEVICES

Takeshi Takagi, Musashino-shi, Hiroshi Ueda, Tokyo-to, Masami Tomono, Kitatama-gun, Tokyo-to, and Hirokazu Kimura, Koganei-shi, Japan, assignors to Kabushiki Kaisha Hitachi Seisakusho, Tokyo-to, Japan, a joint-stock company Filed Sept. 24, 1963, Ser. No. 311,106
Claims priority, application Japan, Sept. 24, 1962, 37/41,028
1 Claim. (Cl. 148—1.5)

Figure 1:
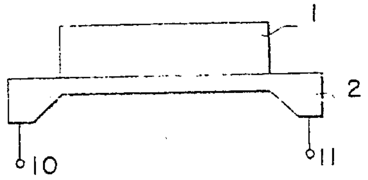

This invention relates to techniques in the manufacture of semiconductor devices, and more particularly it relates to a new method of producing semiconductor devices wherein at least one electron beam is utilized.

Heretofore, the conventional methods of producing pn junctions have been accompanied by the following well recognized difficulties, particularly in the production of small and precise pn junctions. In the alloying method, a jig is necessary, and it is difficult to form small and precise pn junctions; moreover, a carrier metal is necessary for forming an n-type regrowth layer. In the production of a pn junction of small area by the diffusion method, a photo-engraving technique involving a complicated operation and a vacuum evaporation technique using an elaborate or delicate mask alignment are necessary. Furthermore, it is necessary to carry out metal evaporation and alloying on the diffused layer to form electrodes, during which process deposition of the impurity on undesired parts occur easily, wherefore an etching process becomes necessary. Moreover, by the ordinary diffusion method, only graded junctions can be made, and it is difficult to form stepped junctions in deep regions. By the grown junction method, since the pn junction is formed during growth of the crystal, pn junctions cannot be made partly, and the consumption of materials is high. The evaporation-alloying method, similarly as in the case of the diffusion method, requires the use of an elaborate or delicate mask alignment, and precise pn junctions cannot be made in deep regions. In fact, in many cases, only pn junctions with many defects can be made by the evaporation-alloying method since the regrowth layer formed by this method is thinner than that by the usual alloying method.

It is a general object of the present invention to provide a method of producing semiconductor pn junctions which is not accompanied by the above-described difficulties accompanying conventional methods.

More specifically, it is an object to provide a method of forming pn junctions which has several features of advantage and effectiveness, the principal features of which are as follows:

(1) Pn junctions of any desired shape and minute area can be readily made without the necessity of an elaborate or delicate mask alignment, it being also possible to form stepped junctions;

(2) The regrowth layer depth, that is, the depth to which the pn junction is formed, can be controlled at will;

(3) Regrowth layers containing elements such as phosphorus, arsenic, and antimony can be easily made;

(4) A large number of pn junctions can be readily formed on a single semiconductor substrate;

(5) The heating schedule can be controlled at will at the time of pn junction formation;

(6) Pn junctions having substantially little mechanical stress, because of sub-heating, and having excellent electrical characteristics are produced; and (7) It is possible to carry out evaporation and deposition of electrode material on a conduction type conversion region immediately after its formation, within the same apparatus, wherefore good contact between the semiconductor region and the electrode metal can be obtained.

The foregoing object has been achieved by the present invention, which, briefly described, provides a method of producing semiconductor devices which comprises melting at least one region in a desired position on a semiconductor substrate, introducing to the resulting molten region a gas containing an impurity such as to impart to the molten region a conductivity type different from that of the semiconductor substrate, thereby causing the impurity to become mixed in the said molten region, then causing the molten region to undergo regrowth to form a pn junction. In a further process step subsequent to the foregoing procedure, an electrode metal is caused, within the same process apparatus, to adhere to the resulting regrowth region.

The nature and details of the invention will be more clearly apparent by reference to the following description concluding with an example of a preferred embodiment of the invention wherein reference is made to the accompanying drawing in which:

FIGURES 1 through 4 are vertical sectional views indicating the process of the example of this invention.

In general, the method of the present invention may be practiced in the following manner. An electron beam is projected on and caused to melt at least one region of desired shape at a desired position on the surface of a semiconductor crystal. This region to be so irradiated and melted is selected according to necessity to be at one location or at a plurality of locations, and the desired depth of the molten part is obtained by controlling the intensity of the electron beam. Thereafter, an active impurity for imparting the desired conduction type to the semiconductor, or a compound of the impurity, is vaporized. During this process, the vapor source is placed in a graphite boat disposed at a position separated slightly from the semiconductor specimen and is heated by means of a Nichrome wire heating element, or, alternately, the said vapor source material may be placed in the vicinity of the specimen and heated and vaporized directly by the electron beam. The gas produced in this manner is conducted to the above-described molten region or to the vicinity of the aforesaid semiconductor substrate having the said molten region. During this step, the active impurity readily diffuses in and uniformly mixes with the molten region but diffuses with much greater difficulty in the solid part. Consequently, a surface conversion layer due to the active impurity is formed in only a very thin surface layer. After the desired quantity of the active impurity has been dissolved under these conditions in the molten semiconductor region, the irradiation intensity of the heating electron beam is reduced, and the melt is caused to form the desired pn junction.

During the above-described process, if necessary, the substrate crystal is heated by a separately provided heating device (for example, a resistance heater, a RF heater, or an electron beam irradiation heater) so as to reduce the temperature gradient within the crystal, or the intensity of either or both of the said heating device and the electron beam is controlled so as to cause the melt to be cooled and undergo regrowth according to a selected temperature schedule, thereby to form the desired pn junction.

Then, depending on the necessity, a metal material to form the electrodes is evaporated and deposited within the same apparatus. The surface of the region which was not melted and regrown is then etched to remove different layers of undesirable conduction type and evaporated metal adhering to undesired parts.

The details of the invention will be better understood by consideration of the following example of a preferred embodiment of the invention.

Figure 2:
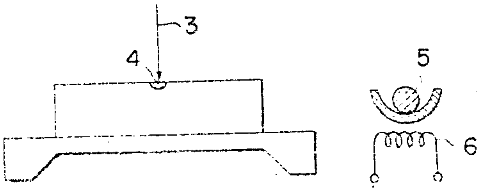
Figure 3:
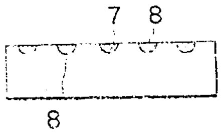
Figure 4:
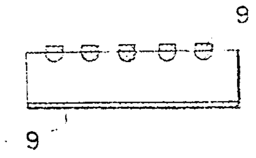

Referring to FIGURE 1, a p-type germanium wafer 1 of 5 ohm-cm. resistivity and 2 x 2 x 0.2 mm. size was supplementarily heated beforehand to 600 degrees centigrade by a resistance heater in the form of a graphite plate 2 on which the germanium wafer was placed and heated by passing current between electrodes 10 and 11 provided on the graphite plate 2. Then, regions of 5-micron diameter and 30-micron depth were melted by means of an electron beam 3 at space intervals of 45 microns in the wafer. One such melted region 4 is shown in FIGURE 2. Next, a $P_2O_5$ source 5 was heated to 300 degrees centigrade by means of a resistance furnace 6, and the resulting gas was lead to the wafer and caused to mix into the melt 4. Thereafter, the intensity of the electron beam 3 and temperature of the resistance heater were so varied as to cause the wafer to cool at a rate of 10 deg. centigrade per minute, and an n-type regrowth region 7 containing a desired quantity of phosphorus was formed on the wafer 1. By the above-described procedure, 1,600 pn junctions 8 were formed on the wafer 1. A part of this wafer 1 after this procedure is shown in FIGURE 3. Then, by using a suitable mask, a gold-antimony alloy was deposited by evaporation on the regrowth regions 7 to form electrodes 9. Thereafter, the n-type layer formed on regions other than the regrowth region and gold-antimony film adhering to undesired regions were removed by etching. Finally, leads were attached onto the gold-antimony electrodes.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claim.

What is claimed is:

A process of producing semiconductor devices which comprises heating a p-type semiconductor element by means of a resistance type of heating; melting a portion of the semi-conductor by an electron beam; evaporating an n-type of impurity to cause it to enter the molten portion of said semiconductor; causing the semiconductor to freeze and form a regrowth region and pn-junction; and then depositing on the layer of regrowth region a metal layer by vacuum deposition.

References Cited by the Examiner

UNITED STATES PATENTS

| | | | |
|---|---|---|---|
| 2,778,926 | 1/1957 | Schneider. | |
| 2,793,282 | 2/1957 | Steigerwald. | |
| 2,809,905 | 10/1957 | Davis. | |
| 2,909,453 | 10/1959 | Losco | 148—180 |
| 2,956,913 | 10/1960 | Mack | 148—177 |
| 3,092,522 | 6/1963 | Knowles | 148—180 |
| 3,143,443 | 8/1964 | Moserjian | 148—180 |
| 3,153,600 | 10/1964 | Feuillade | 148—179 |

HYLAND BIZOT, *Primary Examiner.*